US 10,132,860 B2

(12) United States Patent
Glaeser et al.

(10) Patent No.: US 10,132,860 B2
(45) Date of Patent: Nov. 20, 2018

(54) SYSTEMS AND METHODS FOR TESTING PACKAGE ASSEMBLIES

(71) Applicant: FREESCALE SEMICONDUCTOR, INC., Austin, TX (US)

(72) Inventors: Richard Kenneth Glaeser, Lakeway, TX (US); Mickey Mitchell Bowers, Dripping Springs, TX (US)

(73) Assignee: NXP USA, Inc., Austin, TX (US)

( * ) Notice: Subject to any disclaimer, the term of this patent is extended or adjusted under 35 U.S.C. 154(b) by 182 days.

(21) Appl. No.: 15/337,821

(22) Filed: Oct. 28, 2016

(65) Prior Publication Data

US 2018/0120373 A1    May 3, 2018

(51) Int. Cl.
*G01R 31/28*  (2006.01)
*H01L 21/67*  (2006.01)
*H01L 21/66*  (2006.01)
*G01R 31/3181*  (2006.01)
*G01R 31/30*  (2006.01)

(52) U.S. Cl.
CPC ..... *G01R 31/2856* (2013.01); *G01R 31/2834* (2013.01); *G01R 31/2863* (2013.01); *G01R 31/2879* (2013.01); *G01R 31/31813* (2013.01); *H01L 21/67288* (2013.01); *H01L 22/14* (2013.01); *G01R 31/3004* (2013.01)

(58) Field of Classification Search
CPC .......... G01R 33/20; G01V 3/32; G01N 24/00; A61B 5/055
USPC ........................ 324/200, 300, 301, 307, 309
See application file for complete search history.

(56) References Cited

U.S. PATENT DOCUMENTS

| 4,637,020 | A | 1/1987 | Schinabeck |
| 5,030,905 | A | 7/1991 | Figal |
| 5,241,264 | A | 8/1993 | Nishiura |
| 6,617,972 | B2* | 9/2003 | Takarada ........... G08B 21/0484 |
| | | | 324/538 |
| 7,436,984 | B2 | 10/2008 | Auberger |
| 8,779,729 | B2* | 7/2014 | Shiraishi ............ G01R 31/3606 |
| | | | 320/155 |
| 2008/0030217 | A1 | 2/2008 | Patel et al. |
| 2010/0026329 | A1 | 2/2010 | Watanabe et al. |
| 2011/0002540 | A1 | 1/2011 | De Haan |
| 2012/0098518 | A1* | 4/2012 | Unagami ............. G01R 22/066 |
| | | | 324/74 |
| 2017/0060150 | A1* | 3/2017 | Stefanski ............... G05D 23/27 |

(Continued)

OTHER PUBLICATIONS

Chang et al., "SHOrt Voltage Elevation (SHOVE) Test for Weak CMOS ICs," Stanford University, IEEE, 1997, pp. 446-451.

(Continued)

*Primary Examiner* — Giovanni Astacio-Oquendo (57) ABSTRACT

A method for stress testing a device under test (DUT) having a plurality of pins includes generating a stress test pattern which independently stresses each pin of the plurality of pins, wherein the stress test pattern includes a plurality of test vector, and applying each test vector to the plurality of pins for a predetermined amount of time. The method further includes, after applying all the test vectors of the stress test pattern, applying a programmable load to each pin independently and after applying each programmable load, comparing an output voltage of each pin to a predetermined voltage range to form an output vector for each pin.

20 Claims, 4 Drawing Sheets

(56) References Cited

U.S. PATENT DOCUMENTS

2018/0036740 A1\* 2/2018 Nelson .................... B02C 19/18
2018/0059176 A1\* 3/2018 Ding .................. G01R 31/2891

OTHER PUBLICATIONS

Kawahara et al, "The Effectiveness of IDDQ and High Voltage Stress for Burn-in Elimination," Kawasaki-steel, Inc., 1996, IEEE, pp. 9-13.

\* cited by examiner

|  | PIN(0) | PIN(1) | PIN(2) | ... | PIN(N) |
|---|---|---|---|---|---|
| TEST VECTOR 0 | 1 | 0 | 0 | ... | 0 |
| TEST VECTOR 1 | 0 | 1 | 0 | ... | 0 |
| TEST VECTOR 2 | 0 | 0 | 1 | ... | 0 |
| ... | | | | | |
| TEST VECTOR N | 0 | 0 | 0 | ... | 1 |

FIG. 3

|  | PIN(0) | PIN(1) | PIN(2) | ... | PIN(N) |
|---|---|---|---|---|---|
| TEST VECTOR 0 | M | 0 | 0 | ... | 0 |
| TEST VECTOR 1 | 0 | M | 0 | ... | 0 |
| TEST VECTOR 2 | 0 | 0 | M | ... | 0 |
| ... | | | | | |
| TEST VECTOR N | 0 | 0 | 0 | ... | M |

SYSTEMS AND METHODS FOR TESTING PACKAGE ASSEMBLIES

BACKGROUND OF THE INVENTION

The present invention relates generally to semiconductor package testing, and more particularly, to testing packaged semiconductor devices at the package level.

Defects introduced in the backend of the silicon manufacturing process can cause faulty parts to be unknowingly shipped to customers. These defects can include, but are not limited to, scratches on the surface of the wafer due to manual handling, and to defects introduced in the package assembly process itself. Scratches on the surface of the wafer can create shorts between power and ground straps. Defects in the package assembly process can include defects on the substrate and wire bond.

In order to reduce the number of latent defects of packaged semiconductor devices being shipped to the field, high voltage stress test (HVST) is an industry-wide technique to accelerate defects to failure by elevating power supplies above their specification. The focus of traditional HVST is on wafer fab defects that affect the integrity of gate oxide and contacts, for example. Often, this technique is used at wafer-level test, before the package assembly process. Accordingly, defects introduced after wafer-level test and during the assembly process will not be accelerated by traditional HVST.

Traditional HVST stresses only power pins with elevated voltage. Traditional continuity and leakage electrical testing groups inputs/outputs into two groups that are stressed in parallel, i.e. evens and odds. This is done to reduce test time, but it leaves open a potential hole in coverage for complex packages, ball grid arrays for example, which even and odd groupings do not adequately address.

It is therefore desirable to provide a cost effective method for accelerating defects introduced during the assembly process on any input/output, power or ground pin, and to screen for defects during package-level test.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like reference numbers indicate similar elements.

DETAILED DESCRIPTION OF THE PRESENT INVENTION

The detailed description of the appended drawings is intended as a description of the currently preferred embodiments of the present invention, and is not intended to represent the only forms in which the present invention may be practiced. It is to be understood that the same or equivalent functions may be accomplished by different embodiments that are intended to be encompassed within the scope of the claims.

Embodiments of systems and methods disclosed herein provide pin-level stress to accelerate defects introduced after the traditional HVST stress. These defects include defects from manual handling during and after wafer-level ATE testing and from package assembly. One pin is stressed at a time, but the test time impact is minimized by using a functional pattern to apply the stress voltage. Test equipment is used to place all pins at ground or 0 Volts, except one, to which a stress voltage is applied. One by one, the voltage on each pin is set to its highest allowable voltage for a period of time. Once the stress voltage is applied, a mid-range voltage is applied, and the output of all the pins is compared to an input pattern to determine whether the stressed pin is shorted to any of the other pins. In this manner, all pins on a packaged semiconductor device are tested for defects before being deployed in the field.

Figure 1:
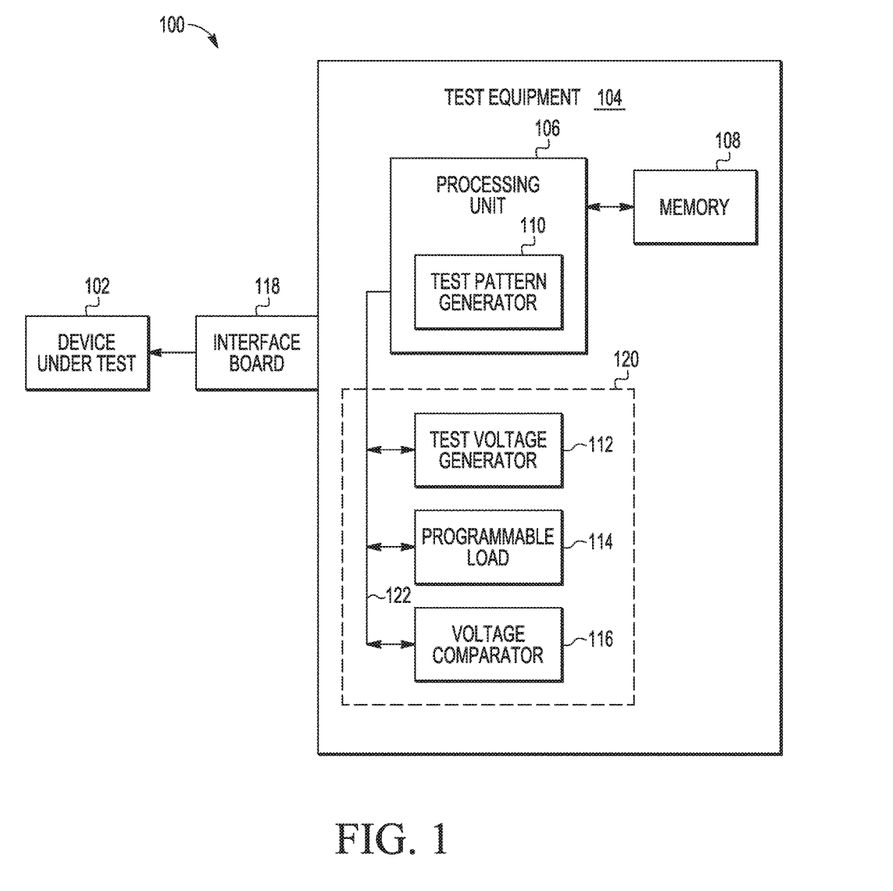
FIG. 1 is a block diagram of test equipment for a packaged semiconductor device in accordance with selected embodiments of the present invention.

FIG. 1 is a block diagram of test equipment 100 for a packaged semiconductor device in accordance with selected embodiments of the present invention that includes device under test (DUT) 102, automated test equipment 104, processing unit 106, memory 108, test pattern generator 110, and test electronics including test voltage generator 112, programmable load circuitry 114, and voltage comparator circuitry 116 coupled processing unit 106. Interface board 118 couples or adapts components of test equipment 104 to DUT 102. Bus or link 122 in test equipment 104 can be used to couple components of test electronics 120 to each other, to processing unit 106, and to interface board 118.

DUT 102 can be any packaged semiconductor device with electrically conductive pads or pins (not shown) that can be coupled to interface board 118. The semiconductor package can be a metal, plastic, glass or ceramic casing containing one or more semiconductor electronic components. The package provides protection against impact and corrosion, holds the contact pins or leads which are used to connect from external circuits to the device. Each pin to be tested has a separate connection to interface board 118 that is independent of the other pins. Examples of package types that can be coupled to interface board can include, but are not limited to, pin grid array, flat package, small outline package, chip-scale package, ball grid array, and multi-chip packages.

Processing unit 106 can include any one or more core processing device(s) coupled to internal memory and/or cache and can be programmed or configured to synchronize operation of test pattern generator 110, and test equipment 120. Processing unit 106 can be used to develop test applications. Memory 108 can be one or more of any suitable type of memory for storing test program code, test results, test parameters, and other suitable information. Processing unit 106 can further be coupled to a network (not shown) to access additional information and communicate with external systems, peripherals, and other types of components.

Test pattern generator 110 can be a software program executable by processing unit to generate test patterns that are used to drive test electronics 120 during a test. Test equipment 104 can include a user console to enable an operator to view, add, delete, or modify information used by test pattern generator 110 as well as test electronics 120. In selected embodiments, test pattern generator 110 is configured to specify a pattern of voltages to be applied to each of the pins of the DUT 102. The frequency of the pattern can be relatively slow in order to maximize the amount of time each pin is stressed. For example, a 1 MHz vector rate equates to 1 microsecond of stress time per pin. Stress time can be increased by slowing down the vector rate or duplicating vectors in the pattern.

Voltage comparator circuitry 116 includes amplifiers coupled to comparators. Each amplifier has an input coupled to a test voltage and a corresponding programmable load. An output of each amplifier is a component of a signature vector that is compared to the input vector to determine whether the input vector matches the output vector.

Figure 2:
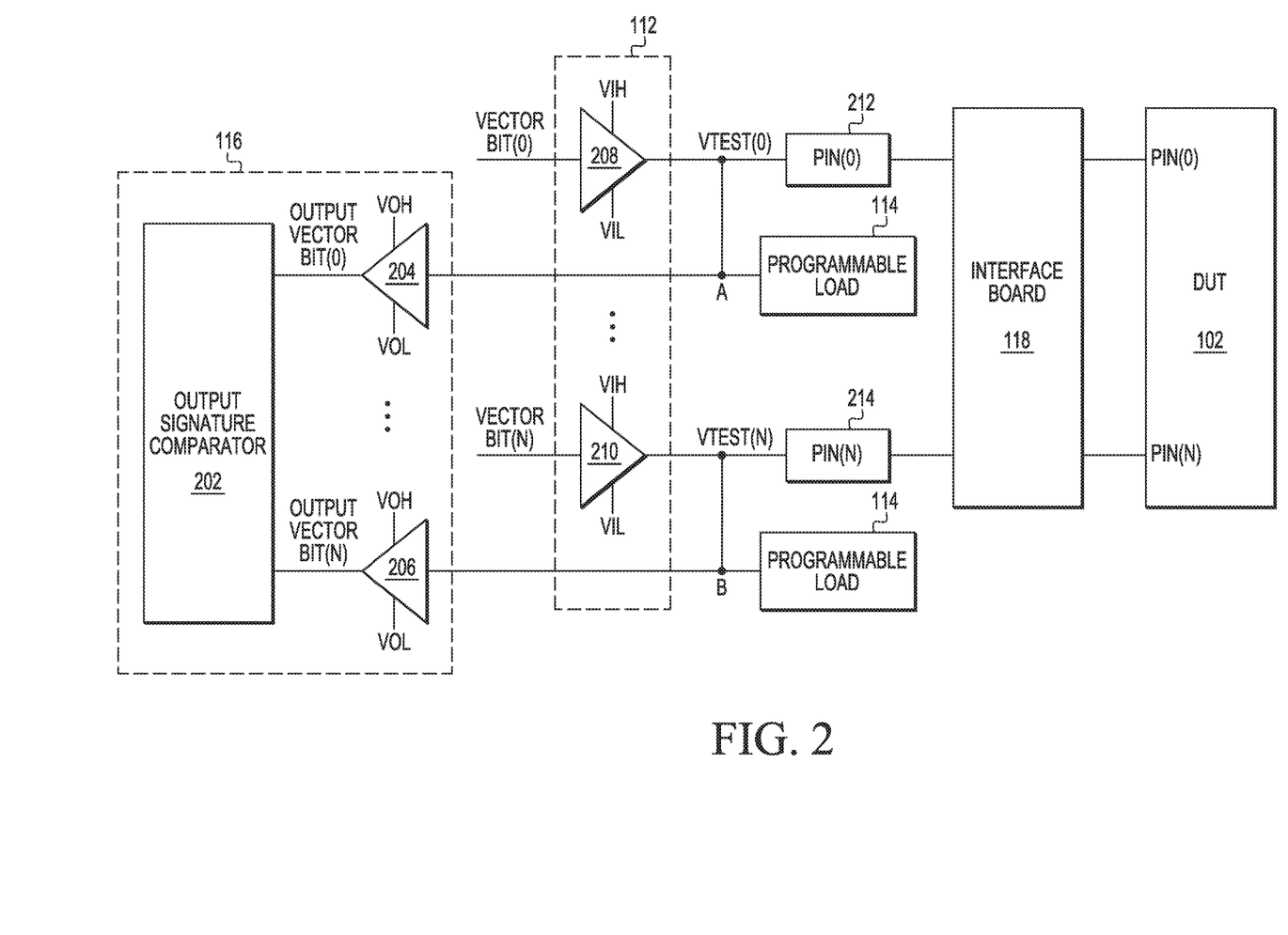
FIG. 2 is a block diagram of an embodiment of a test electronics that can be used in the test equipment of FIG. 1.

FIG. 2 is a block diagram showing additional details of embodiments of components that can be used in test equipment 104 of FIG. 1. Test pattern generator 110 (FIG. 1) provides vector bits (0:N) to test voltage generator 112. Each of vector bits (0:N) is input to a respective one of amplifiers 208, 210 of test voltage generator 112. Amplifiers 208, 210 are coupled between high input voltage (VIH) and low input voltage (VIL). Output from amplifiers 208, 210 are test voltage bits VTEST (0:N) that are coupled to respective ones of pins (0:N) 212, 214. Pins 212, 214 are coupled to interface board 118 and to corresponding pins (0:N) on device under test (DUT) 102.

Voltage comparator circuitry 116 includes output signature comparator 202 coupled to outputs of amplifiers 204, 206. Programmable load 114 is coupled at node A to test voltage bit VTEST(0) from amplifier 208. Node A is coupled to a single input of amplifier 204. Programmable load 114 is also coupled at node B to test voltage bit VTEST(N) from amplifier 210. Node B is coupled to a single input of amplifier 206. Amplifiers 204, 206 are coupled between high output voltage (VOH) and low output voltage (VOL). The output of amplifiers 204, 206 are respective output vector bits (0:N) coupled as input to output signature comparator 202. Output signature comparator 202 includes comparators (not shown) that indicate whether the output vector bits (0:N) match the input test vector VTEST bits (0:N).

Figure 3:
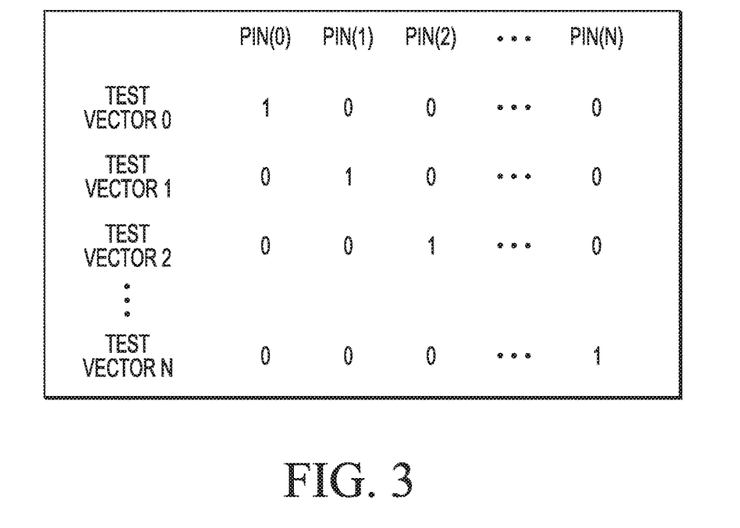
FIG. 3 shows examples of stress test vectors that can be used to test a packaged device with the test equipment of FIG. 1.

The test pattern is designed to initially put most, if not all, the pins into tri-state mode. During a second test phase, the test pattern can set all possible pins to low input voltage (VIL) or "0" voltage, where VIL can be set to 0 V or slightly below 0 V. Then a high input voltage VIH (set to maximum specification for DUT 102 or slightly above) can be applied to each pin, one at a time, until the VIH is applied to each pin. FIG. 3 shows examples of stress test vectors (0:N) that can be used to test DUT 102 with test equipment 104 of FIG. 1 during the second test phase. Test vector (0) sets high voltage on pin (0) and low voltage on pins (1:N). Test vector (1) sets high voltage on pin (1) and low voltage on pins (0) and (2:N). Test vector (2) sets high voltage on pin (2) and low voltage on pins (0:1) and (3:N). Test vector (N) sets high voltage on pin (N) and low voltage on pins (0:N–1).

Figure 4:
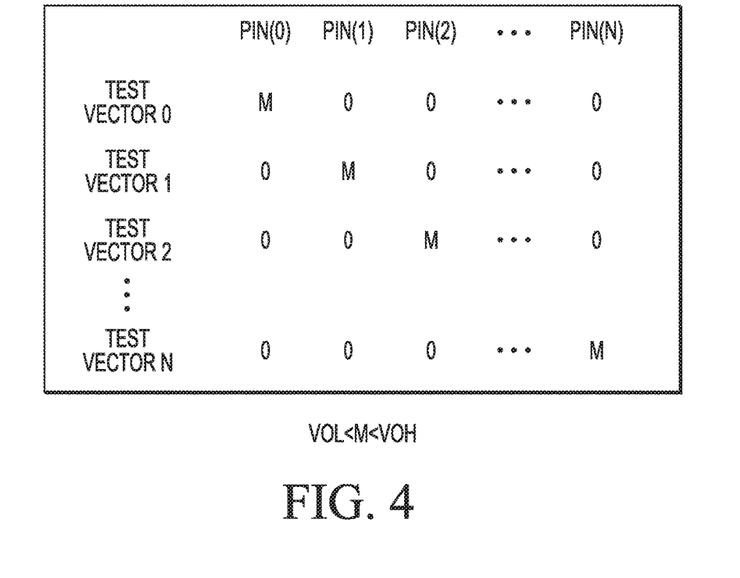
FIG. 4 shows examples of programmable load vectors that can be used to test a packaged semiconductor device with the test equipment of FIG. 1.

During a third test phase, the pattern ends with a functional check of whether the pins are shorted. Programmable load circuitry 114 of test equipment 104 is set to something between low output voltage (VOL) and high output voltage (VOH), where VOL is greater than 0V, and VOH is less than maximum specification voltage. The programmable load can be half of the high output voltage VOH, for example. Other suitable intermediate values for the programmable can be used, however. All pins can be set to VIL and an attempt to detect an output valid signal can be made one at a time across each pin. The output valid signal indicates whether the pin has floated up to the programmable load voltage and is not shorted to VIL nor VIH. In other words, the pin is not shorted to power, ground, or any other pin. FIG. 4 shows examples of stress test vectors (0:N) that can be used to test DUT 102 with test equipment 104 of FIG. 1 during the third test phase. Test vector (0) sets intermediate voltage M on pin (0) and low voltage (0) on pins (1:N). Test vector (1) sets intermediate voltage M on pin (1) and low voltage on pins (0) and (2:N). Test vector (2) sets intermediate voltage M on pin (2) and low voltage on pins (0:1) and (3:N). Test vector (N) sets intermediate voltage M on pin (N) and low voltage on pins (0:N–1).

Figure 5:
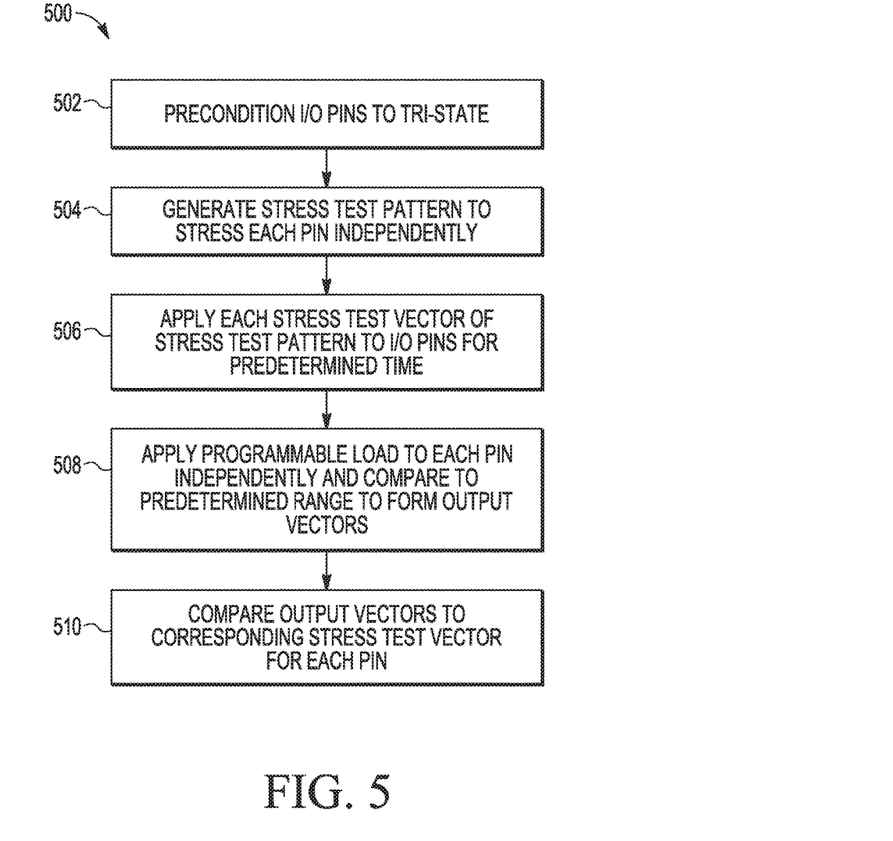
FIG. 5 is a flow diagram of method for testing a packaged semiconductor device using the test equipment of FIG. 1, in accordance with selected embodiments of the present invention.

Referring to FIGS. 2 and 5, FIG. 5 is a flow diagram of method 500 for testing a packaged semiconductor device using the test equipment 104 of FIG. 1, in accordance with selected embodiments of the present invention. Process 502 includes preconditioning pins 212, 214 to a tri-state mode by disabling output of test vectors (0:N) from amplifiers 208, 210. Once pins 212, 214 are tri-stated, process 504 generates a stress test pattern to stress each pin 212, 214 independently of other pins. The stress test pattern can be generated by test pattern generator 110, for example, or other suitable component. The test pattern can increment through the available pins sequentially, one at a time, as shown for example, by the test patterns in FIGS. 3 and 4. Alternatively, stress test vectors can be applied to each of pins 212, 214 nonsequentially (out of order), one at a time.

Process 506 includes applying each stress test vector of the stress test pattern to pins 212, 214, for a predetermined amount of time. The amount of time can be chosen based on the level of voltage being applied, the structure of components in DUT 102, and other suitable factors. The time should be selected to replicate stress that is likely to be experienced by DUT 102 in the field.

Once the stress test vectors have been applied to each pin independently in process 506, process 508 includes applying a programmable load to each pin independently. The programmable load is a voltage between a high and a low voltage, according to the specifications of DUT 102. Once the mid-range or intermediate voltage is applied, the output of all the pins is compared to the input pattern to determine whether any of the pins are shorted to any of the other pins in process 510. In this manner, all pins on a packaged semiconductor device are tested for defects before being deployed in the field.

By now it should be appreciated that in some embodiments, there has been provided a method for stress testing a device under test (DUT) having a plurality of pins that can include generating a stress test pattern which independently stresses each pin of the plurality of pins. The stress test pattern includes a plurality of test vectors. Each test vector is applied to the plurality of pins for a predetermined amount of time. After applying all the test vectors of the stress test pattern, a programmable load (M) is applied to each pin independently. After applying each programmable load, an output voltage of each pin is compared to a predetermined voltage range (e.g. VOL-VOH) to form an output vector for each pin.

In another aspect, applying a programmable load to each pin independently can comprise selecting each pin of the plurality of pins in turn, wherein for each selected pin, a programmable load is applied while all other pins that are not selected remain at ground.

In another aspect, applying to the programmable load to each pin can comprise providing a predetermined current to each pin.

In another aspect, the predetermined current can be provided to each pin at a voltage level that is less than a maximum operating voltage.

In another aspect, the predetermined current can be provided to each pin at a voltage level that is half the maximum operating voltage.

In another aspect, comparing an output voltage of each pin to a predetermined voltage range to form an output vector for each pin can comprise for each pin, if the output voltage of the pin is within the predetermined voltage range, setting a next bit in the output vector for the pin to a first logic value else setting the next bit in the output vector to a second logic value different from the first logic value.

In another aspect, the method can further comprise, prior to applying the test vectors to the plurality of pins, placing each pin of the plurality of pins in a tri-state mode.

In another aspect, applying each test vector to the plurality of pins for a predetermined amount of time can comprise applying a stress voltage (e.g. Vtest at VIH) to only one pin of the plurality of pins while maintaining all other pins of the plurality of pins at ground.

In another aspect, the method can further comprise comparing the output vectors to an expected signature for each pin, wherein the expected signature for each pin is defined by the stress test pattern.

In other selected embodiments, a method for stress testing a device under test (DUT) having a plurality of pins can comprise applying a stress voltage to only one pin of the plurality of pins while maintaining all other pins of the plurality of pins at ground, repeating the applying the stress voltage to only one pin for each pin of the plurality of pins until each pin has received the stress voltage, after each pin has received the stress voltage, forcing a predetermined current onto only one pin of the plurality of pins while maintaining all other pins of the plurality of pins at ground and comparing an output voltage of the only one pin to a voltage threshold, and repeating the forcing and comparing for each pin of the plurality of pins until the predetermined current has been forced onto all pins of the plurality of pins.

In another aspect, the comparing the output voltage of the only one pin to the voltage threshold can comprise setting a next bit of an output vector for the only one pin to a first logic value if the output voltage exceeds the voltage threshold and setting the next bit of the output vector to a second logic value, different from the first logic value, if the output voltage does not exceed the voltage threshold.

In another aspect, the method can further comprise, prior to applying the stress voltage to any of the plurality of pins, placing all of the plurality of pins into a tri-state mode.

In another aspect, the predetermined current forced onto each pin can be generated at a voltage level that is less than a maximum operating voltage.

In another aspect, the voltage threshold can be a value between zero and the voltage level.

In another aspect, the comprising the output voltage of the only one pin to a voltage threshold can comprise comparing the output voltage to a lower voltage threshold and an upper voltage threshold.

In another aspect, the method can further comprise, in response to the forcing and comparing, forming output vectors for each pin; and comparing each output vector to an expected signature for each pin, wherein the expected signature for each pin is defined by the stress test pattern.

In further selected embodiments, a testing system for stress testing a device under test (DUT) having a plurality of pins can comprise a test pattern generator configured to generate a stress test pattern which independently stresses each pin of the plurality of pins. The stress test pattern includes a plurality of test vectors. A test voltage generator can be configured to supply a stress voltage to each pin of the plurality of pins. A programmable load can be configured to provide a predetermined current to each pin of the plurality of pins. A voltage comparator can be configured to compare an output voltage of each pin to a predetermined voltage range to form an output vector for each pin. Test control circuitry can be configured to apply each test vector of the stress test pattern to the plurality of pins for a predetermined amount of time using the test voltage generator and, after applying all the test vectors of the stress test pattern, applying the programmable load to each pin independently. A voltage comparator can be configured to, in response to applying the programmable load to each pin, compare an output voltage of each pin to a predetermined voltage range to form an output vector for each pin.

In another aspect, the test generator can be configured to, when the test control circuitry is applying each test vector of the stress test pattern, supply a stress voltage to only one pin of the plurality of pins while maintaining all other pins of the plurality of pins at ground.

In another aspect, the programmable load can be configured to, when the test control circuitry is applying the programmable load to each pin independently, provide the predetermined current onto only one pin of the plurality of pins while maintaining all other pins of the plurality of pins at ground.

In another aspect, the system can further comprise an output signature comparator configured to compare the output vectors to an expected signature for each pin, wherein the expected signature for each pin is defined by the stress test pattern.

Because the apparatus implementing the present disclosure is, for the most part, composed of electronic components and circuits known to those skilled in the art, circuitry details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method using automated test equipment for stress testing a device under test (DUT) having a plurality of pins, the method comprising:
   generating a stress test pattern which independently stresses each pin of the plurality of pins, wherein the stress test pattern includes a plurality of test vectors;
   applying each test vector to the plurality of pins, wherein each test vector is applied for a predetermined amount of time;
   after applying all the test vectors of the stress test pattern, applying a programmable load to each pin independently and after applying each programmable load, comparing an output voltage of each pin to a predetermined voltage range to form an output vector for each pin.

2. The method of claim 1, wherein applying a programmable load to each pin independently comprises:
   selecting each pin of the plurality of pins in turn, wherein for each selected pin, a programmable load is applied while all other pins that are not selected remain at ground.

3. The method of claim 2, wherein applying to the programmable load to each pin comprising providing a predetermined current to each pin.

4. The method of claim 3, wherein the predetermined current is provided to each pin at a voltage level that is less than a maximum operating voltage.

5. The method of claim 4, wherein the predetermined current is provided to each pin at a voltage level that is half the maximum operating voltage.

6. The method of claim 1, wherein comparing an output voltage of each pin to a predetermined voltage range to form an output vector for each pin comprises:
   for each pin, if the output voltage of the pin is within the predetermined voltage range, setting a next bit in the output vector for the pin to a first logic value else setting the next bit in the output vector to a second logic value different from the first logic value.

7. The method of claim 1, further comprising, prior to applying the test vectors to the plurality of pins, placing each pin of the plurality of pins in a tri-state mode.

8. The method of claim 1, wherein applying each test vector to the plurality of pins comprises applying a stress voltage to only one pin of the plurality of pins while maintaining all other pins of the plurality of pins at ground.

9. The method of claim 1, further comprising:
   comparing the output vectors to an expected signature for each pin, wherein the expected signature for each pin is defined by the stress test pattern.

10. A method using automated test equipment for stress testing a device under test (DUT) having a plurality of pins, the method comprising:
    applying a stress voltage to only one pin of the plurality of pins while coupling all other pins of the plurality of pins to ground;
    repeating the applying the stress voltage to only one pin for each pin of the plurality of pins until each pin has received the stress voltage;
    after each pin has received the stress voltage, forcing a predetermined current onto only one pin of the plurality of pins while maintaining all other pins of the plurality of pins at ground and comparing an output voltage of each pin to a voltage threshold; and
    repeating the forcing and comparing for each pin of the plurality of pins until the predetermined current has been forced onto all pins of the plurality of pins.

11. The method of claim 10, wherein the comparing the output voltage of each pin to the voltage threshold comprises: setting a next bit of a corresponding output vector for the pin to a first logic value if the output voltage exceeds the voltage threshold and setting the next bit of the corresponding output vector to a second logic value, different from the first logic value, if the output voltage does not exceed the voltage threshold.

12. The method of claim 10, further comprising:
    prior to applying the stress voltage to any of the plurality of pins, placing all of the plurality of pins into a tri-state mode.

13. The method of claim 10, wherein the predetermined current forced onto each pin is generated at a voltage level that is less than a maximum operating voltage.

14. The method of claim 13, wherein the voltage threshold is a value between zero and the voltage level.

15. The method of claim 10, wherein the comparing the output voltage of each pin to the voltage threshold comprises comparing the output voltage of each pin to a lower voltage threshold and an upper voltage threshold.

16. The method of claim 10, further comprising:
    in response to the forcing and comparing, forming output vectors for each pin; and
    comparing each output vector to an expected signature for each pin, wherein the expected signature for each pin is defined by the stress test pattern.

17. A testing system for stress testing a device under test (DUT) having a plurality of pins, the system comprising:
    a test pattern generator configured to generate a stress test pattern which independently stresses each pin of the plurality of pins, wherein the stress test pattern includes a plurality of test vectors;
    a test voltage generator configured to supply a stress voltage to each pin of the plurality of pins;
    a programmable load configured to provide a predetermined current to each pin of the plurality of pins;
    test control circuitry configured to apply each test vector of the stress test pattern to the plurality of pins for a predetermined amount of time using the test voltage generator and, after applying all the test vectors of the stress test pattern, applying the programmable load to each pin independently; and
    a voltage comparator configured to, in response to applying the programmable load to each pin, compare an output voltage of each pin to a predetermined voltage range to form an output vector for each pin.

18. The system of claim 17, wherein the test generator is configured to, when the test control circuitry applies each test vector of the stress test pattern, supply a stress voltage to only one pin of the plurality of pins while coupling all other pins of the plurality of pins to ground.

19. The system of claim 17, wherein the programmable load is configured to, when the test control circuitry applies the programmable load to each pin independently, provide the predetermined current onto only one pin of the plurality of pins while maintaining all other pins of the plurality of pins at ground.

20. The system of claim 17, further comprising an output signature comparator configured to compare the output vectors to an expected signature for each pin, wherein the expected signature for each pin is defined by the stress test pattern.

* * * * *